United States Patent [19]
Trolle et al.

[11] Patent Number: 5,625,207
[45] Date of Patent: Apr. 29, 1997

[54] SEMICONDUCTOR COMPONENT WITH CONDUCTORS AT DIFFERENT LEVELS

[75] Inventors: Sten Trolle, Ystad; Christer Svensson, Ljungsbro, both of Sweden

[73] Assignee: Elsa Elektroniska Systems and Applications AB, Ystad, Sweden

[21] Appl. No.: 411,814

[22] PCT Filed: Oct. 11, 1993

[86] PCT No.: PCT/SE93/00819

§ 371 Date: May 25, 1995

§ 102(e) Date: May 25, 1995

[87] PCT Pub. No.: WO94/09511

PCT Pub. Date: Apr. 28, 1994

[30] Foreign Application Priority Data

Oct. 9, 1992 [SE] Sweden .................................. 9202984

[51] Int. Cl.$^6$ ................................................. H01L 27/10
[52] U.S. Cl. .......................... 257/207; 257/208; 257/211; 257/401; 257/758
[58] Field of Search ................................ 257/401, 390, 257/204, 207, 208, 211, 758

[56] References Cited

U.S. PATENT DOCUMENTS

| | | | |
|---|---|---|---|
| 3,801,880 | 4/1974 | Harda et al. | 317/234 |
| 4,984,061 | 1/1991 | Matsumoto | 357/68 |
| 5,027,188 | 6/1991 | Owada et al. | 357/68 |
| 5,309,015 | 5/1994 | Kuwata et al. | 257/758 X |
| 5,391,921 | 2/1995 | Kudoh et al. | 257/758 |
| 5,488,238 | 1/1996 | Enraku et al. | |

FOREIGN PATENT DOCUMENTS

| | | | |
|---|---|---|---|
| 0218529 | 4/1987 | European Pat. Off. | H01L 29/78 |
| 0282226 | 9/1988 | European Pat. Off. | H01L 23/52 |
| 0476625 | 3/1992 | European Pat. Off. | 257/758 |

OTHER PUBLICATIONS

Schuster, "VMOS Logic with Two Levels of Wiring," *IBM Technical Disclosure Bulletin*, vol. 22, No. 3, Aug. 1979, pp. 1284–1285.

Primary Examiner—William Mintel
Attorney, Agent, or Firm—Cushman Darby & Cushman IP Group of Pillsbury Madison & Sutro LLP

[57] ABSTRACT

Transistors for controlling high currents are composed of a large number of paralleled transistor elements which are integrated in a semiconductor chip. In order to minimise the forward resistance through the semiconductor chip, the sources and the drains of the transistor elements are arranged on the same side of the semiconductor chip. The sources and the drains of the transistor elements and the source and the drain of the transistor component proper are contacted with one another by means of conductors arranged on at least two different levels, the conductors on a level more distant from the semiconductor chip being fewer than those on a level closer to the semiconductor chip, resulting in a small distance between the element electrode and the component electrode and, consequently, a small contribution to the forward resistance from the contacting.

14 Claims, 2 Drawing Sheets

SEMICONDUCTOR COMPONENT WITH CONDUCTORS AT DIFFERENT LEVELS

BACKGROUND OF THE INVENTION

This invention relates to a semiconductor component having at least a first and a second component electrode and comprising a plurality of semiconductor elements which are integrated in a semiconductor chip and which each include at least a first and a second element electrode provided on the same side of the semiconductor chip, the first element electrodes being connected to the first component electrode, and the second element electrodes being connected to the second component electrode.

When controlling electrical power, the forward resistance of the control elements should be as low as possible. Combining a high breakdown voltage and a low forward resistance, thyristors are often used as control elements. However, thyristors have a forward voltage drop of about 1 volt, which is a disadvantage. Consequently, thyristors are less suitable for controlling electrical power at low voltages.

Transistors, which have a lower forward voltage drop or none at all, may instead be used. Normally, transistors for high currents have their source and their drain arranged on either side of the semiconductor chip in which they are made. As a result, the forward resistance of such transistors at least equals the resistance through the semiconductor chip. The forward resistance caused by the semiconductor chip can be reduced by arranging the drain and the source on the same side of the semiconductor chip. However, the forward resistance will nevertheless be high when controlling high currents. The reason for this will be explained below.

When used for controlling high currents, a large number of transistors have to be connected in parallel. The greater the number of transistors that can be arranged on a given surface of a semiconductor chip, the higher the currents that can be directed through this surface. Since transistor density may today exceed 100,000 transistors per $cm^2$ it will be appreciated that contacting has to involve conductors of minute dimensions if it is to be possible to contact the sources and the drains on the same side of the semiconductor chip. However, minute conductors will have a considerable resistance, which, in turn, leads to a high forward resistance of the transistor component formed by the paralleled transistors.

EP 0 218 529 discloses a field-effect transistor composed of a large number Of field-effect-transistor elements integrated in a semiconductor chip. Each transistor element has a source area, a drain area and a gate area. The source and drain areas are arranged in a checkered pattern. Across the semiconductor chip extend diagonally parallel conductors alternately connecting the source and drain areas to a common source electrode and a common drain electrode, respectively, the common electrodes being arranged adjacent to the source and drain areas. The diagonal conductors are arranged on two levels, the conductors most distant from the semiconductor chip extending across most of the conductors closest to the semiconductor chip and being spaced apart therefrom by a dielectric layer through which contacts extend. Such an arrangement on different levels reduces current density and resistance without there being any need of increasing the width of the conductors. However, the forward resistance is nevertheless high, the average distance between the individual transistor elements and the common electrodes being considerable.

SUMMARY OF THE INVENTION

One object of the present invention is to provide a semiconductor component of lower forward resistance than known semiconductor components of similar type.

Another object of the invention is to provide a semiconductor component suited for controlling high currents and having a lower forward voltage drop than known semiconductor components for controlling high currents.

A further object of the invention is to provide a semiconductor component for controlling high currents, enabling higher current densities than known components of similar type.

The element electrodes of the semiconductor component being arranged on the same side of the semiconductor chip, there is but a small contribution to the forward resistance from the semiconductor chip. Since contacting is performed on several levels with fewer conductors on a level more distant from the semiconductor chip than on a level closer to the semiconductor chip, there is a very small distance from an element electrode to a component electrode and thus a low forward resistance. Unlike the prior art, in which the current Glows substantially parallel to the semiconductor chip from the element electrode to the component electrode, the current in the semiconductor component according to the invention flows substantially perpendicular to the semiconductor chip from the element electrode to the component electrode. In addition, the current flows at least partly through conductors of lower resistance than the element electrodes, which also contributes to a small forward resistance. As the conductors further are arranged on levels outside one another, a major part of the semiconductor surface can be occupied by the semiconductor elements, enabling a high current density. When a transistor, the semiconductor component is suitable for controlling high currents and has a small forward voltage drop. When controlling high currents, it is especially advantageous for the semiconductor component to be a field-effect transistor whose voltage drop is purely resistive when the current approaches zero, unlike that of a bipolar transistor. Furthermore, a field-effect transistor requires less control power than a bipolar transistor.

BRIEF DESCRIPTION OF THE DRAWINGS

Some embodiments of the invention will now be described with reference to the accompanying drawings, in which.

DETAILED DESCRIPTION

Figure 1:
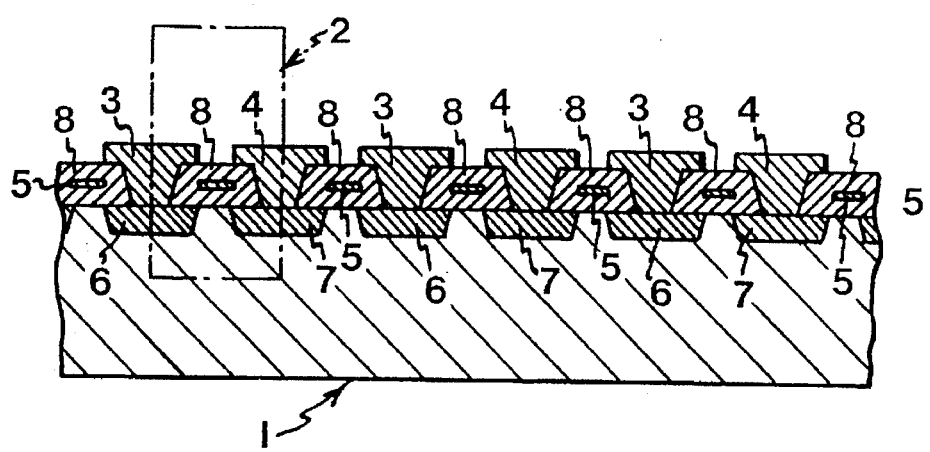
FIG. 1 is a cross-sectional view of part of a semiconductor chip.
Figure 2:
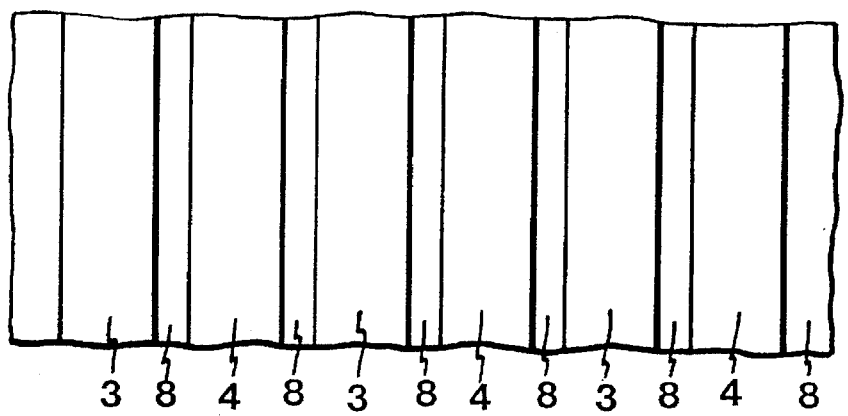
FIG. 2 is a top view of the semiconductor chip in FIG. 1.

FIG. 1 shows a cross-section of part of a semiconductor chip 1, in which are integrated a large number of MOS-type field-effect transistors 2 which are to be connected in parallel to produce a transistor for controlling high currents. Each transistor 2 has three electrodes, namely a source electrode 3, a drain electrode 4 and a gate electrode 5, all arranged on the same side of the semiconductor chip 1 in order to minimize its contribution to the forward resistance. The source electrode 3 is in contact with a doped source area 6, the drain electrode 4 is in contact with a doped drain area 7, and the gate electrode 5 is arranged in an oxide area 8. As appears from FIG. 1, adjoining transistors 2 share the same source and drain electrodes 3, 4. As a result, there is room for more transistors on a given surface and a higher current density can be obtained than would be possible if the transistors had separate source and drain areas 6, 7. As can be seen in FIG. 2, the base, the source and the drain electrode have an elongate shape, and are common to the transistors in a row.

In order to minimize the forward resistance of each transistor 2, the distance between the source area 6 and the drain area 7, i.e. the length of the gate electrode 5, should be as small as possible. For the same reason, the distance between the source electrode 3 and the outer edge of the source area 6, as well as between the drain electrode 4 and the outer edge of the drain area 7, should be minimized.

It appears from the foregoing that the requirements of low forward resistance and high current density entail a semiconductor chip structure of very high geometric resolution, which in turn requires that the contacting achieved by means of the electrodes 3–5 likewise should have a very high resolution.

In order to achieve such a high resolution, the semiconductor chip with the base, source and drain areas 6–8 is coated with a metal layer, which is patterned by lithography, thereby to produce the electrodes 3–5. Lithography may, however, only be used if the thickness of the metal layer is of about the same order as its width. In contacting with high resolution, the metal layer will consequently be fairly thin, giving a high resistance per unit length.

Figure 3:
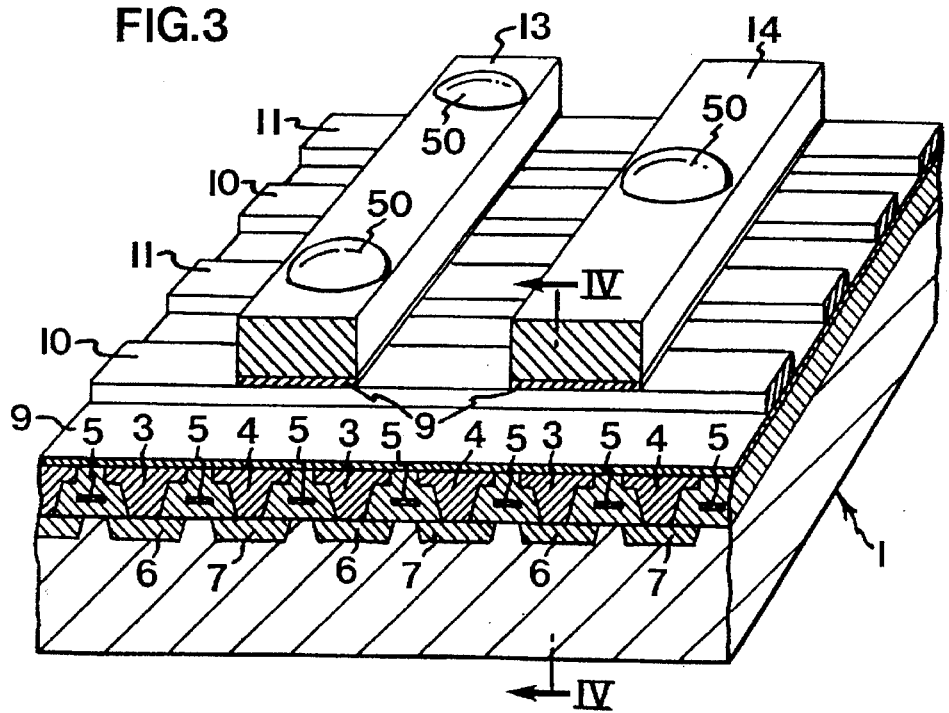
FIG. 3 is a perspective view of a semiconductor chip contacted according to the invention.

FIG. 3, which is a perspective view, illustrates how this problem has been solved in a semiconductor component according to the invention. The figure shows the semiconductor chip 1 with the elongate source and drain electrodes 3 and 4 forming a first level of electrodes. Outside the electrodes 3 and 4, there is provided an insulating layer 9, e.g. consisting of a polymer. Outside the insulating layer 9, there is provided a second level of elongate source electrodes 10 and drain electrodes 11, which are arranged at right angles to the electrodes 3, 4 on the first level.

Figure 4:
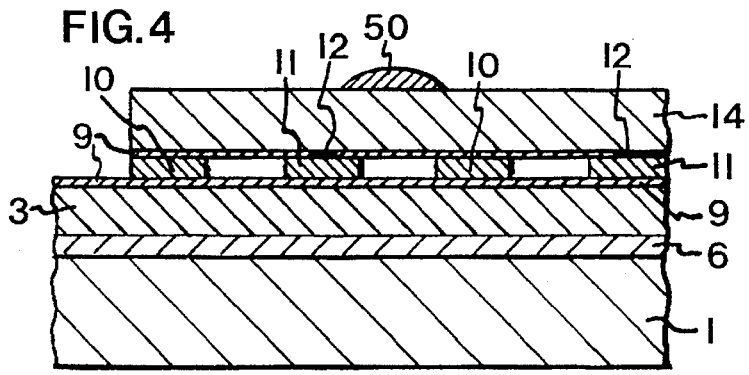
FIG. 4 is a cross-sectional view taken along IV—IV in FIG. 3.

As appears from FIG. 4, the source electrodes 10 on the second level are connected to the source electrodes 3 on the first level by means of connections 12 extending through the insulating layer 9 at the points of intersection of the source electrodes 3, 10 on the different levels. Correspondingly, the drain electrodes 11 are connected to the drain electrodes 4 by means of connections 12 extending through the insulating layer 9 at the points of intersection of the drain electrodes 4, 11 on the different levels.

The source electrodes 10 and the drain electrodes 11 on be second level are of greater width and thickness than the corresponding electrodes 3 and 4, respectively, on the first level. The electrodes 10, 11 on the second level therefore have a lower resistance and thus enable less dense contacting. Preferably, the width and the thickness of the electrodes on the two levels may differ by a factor of about 3.

Outside the second level of electrodes 10, 11, there is provided another insulating layer 9 (only partly shown for greater clarity), a source electrode 13 and a drain electrode 14 being arranged outside this layer to form a third level. As on the second level, the electrodes 13, 14 on the third level are arranged perpendicular to the electrodes 10, 11 on the preceding level. Furthermore, the electrodes 13, 14 are of greater width and thickness than the electrodes 10, 11 on the preceding level and thus have a lower resistance so that they can be contacted on fewer locations.

As already mentioned, such an arrangement with multi-level electrodes and a decrease of the number of electrodes away from the semiconductor chip entails that the sources and drains of a large number of densely-packed transistors can be contacted with a small resistance on the same side of a semiconductor chip. The design of the connection between the gate area 8 of the individual transistors 2 and the common gate electrode of the component formed by the paralleled transistors is less critical in terms of resistance, since this connection conducts a much lower current. The gate electrodes 5 of the transistors 2 can be connected to the common gate electrode at the periphery of the semiconductor chip 1 or on one or more locations on the surface of the semiconductor chip. Should the transistor be a lateral bipolar transistor, the connection may also take place on the reverse side of the semiconductor chip 1.

In the embodiment shown in FIG. 3, the electrodes are arranged on three different levels. Of course, the electrodes may also be likewise arranged on an optional number of levels.

As mentioned, contacting is preferably achieved by lithography, which is suitable for use with conductors having a width of up to about 0.1 mm. A further increase of the conductor dimensions is in no way advantageous, and when the conductors have attained this width, contacting should be performed externally by mechanical means. To this end, the electrodes 13, 14 on the uppermost level of electrodes formed by lithography are advantageously provided with bosses 50 of some soft material, such as gold.

The mechanical contacting between, on the one hand, the semiconductor chip with the different levels of electrodes formed by lithography and, on the other hand, the electrodes in the component package may also involve parallel, elongate electrodes.

Figure 5:
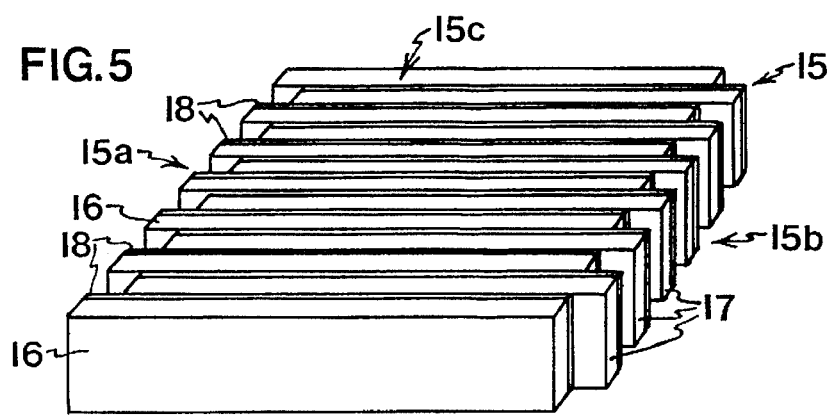
FIG. 5 is a perspective view of a block of joined conductors.

FIG. 5 illustrates an electrode arrangement suitable for contacting between the electrodes of the semiconductor chip and those of the package. This electrode arrangement is made up of a parallelepipedal block 15 comprising alternating source electrodes 16 and drain electrodes 17 which are glued to intermediate insulation 18. The source electrodes 16 and the drain electrodes 17 are longitudinally offset in relation to one another, such that only source electrodes 16 extend in one short side 15a of the block 15 and only drain electrodes 17 extend in the other short side 15b. Both source electrodes 16 and drain electrodes 17 extend in the long sides 15c of the block 15. In contacting, one or more semiconductor chips with the electrodes thereon are applied against the long sides 15c of the block 15, and the source-electrode side 15a and the drain-electrode side 15b are connected to, respectively, the source electrode and the drain electrode of a package.

Figure 6:
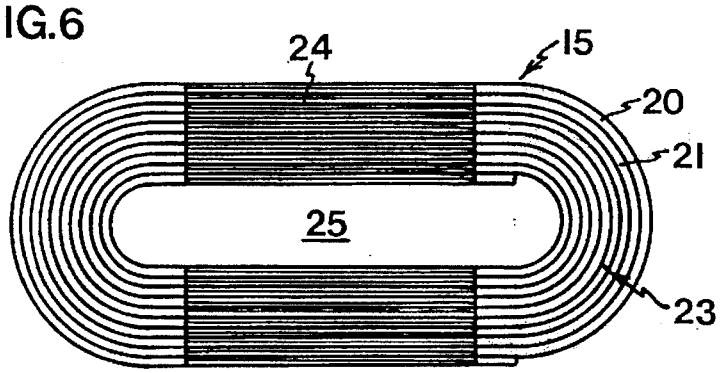
FIG. 6 is a top view of an alternative embodiment of the block in FIG. 5.

FIG. 6 illustrates an alternative embodiment of the block shown in FIG. 5. Here, the block 15 comprises two long electrode bands 20, 21 which, provided with intermediate insulation (not shown), are wound onto a mandrel, the band 20 being slightly offset in the lateral direction in relation to the band 21. After being thus wound onto the mandrel, the bands 20, 21 are fixed in relation to one another and to the insulation, e.g. by being impregnated with glue. This embodiment is advantageous, in that the block 15 holds together even though the glue ages. After fixation, the mandrel is removed, and the surfaces To be used in contacting are worked so as to become perfectly flat.

The surfaces 23 that are to be used for contacting with a package and thus only are to contain one electrode 20 or 21, are worked only slightly. The surfaces 24, on the other hand, that are to be used for contacting with the electrodes of the semiconductor chip are worked more deeply down to a level on which both electrodes 20, 21 extend. Also, this embodiment of the block can be used for jointly contacting several semiconductor chips to a package.

The space 25 occupied by the mandrel when making the block 15 is suitably used for contacting between the semiconductor chips and the gate electrode of the package.

Figure 7:
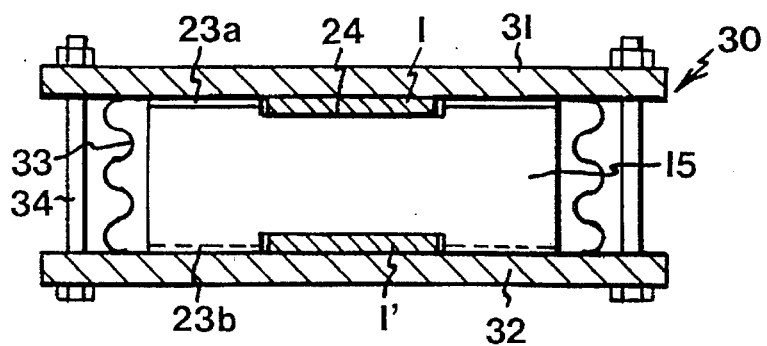
FIG. 7 is a schematic side view of a package with a semiconductor chip mounted therein.

FIG. 7 schematically illustrates a mode of contacting between, on the one hand, the semiconductor chip 1 and the block 15 and, on the other hand, the block 15 and a package 30. A first and a second semiconductor chip 1 and 1' are so arranged that their electrodes face the block surfaces 24 which have been worked more deeply and in which both electrodes extend. The package 30 has two platelike electrodes 31, 32, a tight-fitting and insulating cover 33, and an external joint 34 symbolized by bolts. The more lightly worked block surfaces 23a, which merely contain the one electrode band 20, e.g. in contact with the source electrodes of the semiconductor chips 1, 1', are connected to the one platelike electrode 31, which then constitutes the source electrode of the package. Correspondingly, the surfaces 23b, which merely contain the other electrode band 21, in contact with the drain electrodes of the semiconductor chips 1, 1', are connected to the other platelike electrode 32, which then constitutes the drain electrode of the package. With suitable dimensions and a suitably strong joint 34, one may obtain high-precision and simultaneous connection of the semiconductor chips 1, 1' to the block 15 and of the block 15 to the platelike electrodes 31, 32.

In order that the entire component should have a low forward resistance, it is important that the transitions between the semiconductor chips and the block, as well as between the block and the electrodes of the package, have low resistance. This can be achieved by carefully working the surfaces of the block 15 and by chemically or electrolytically coating these surfaces with some suitable material. By using suitable solders, it then becomes possible to solder or weld together very low-ohmic connections between the block and the package. By using special metal alloys, such as eutectic gold alloys, cold welding may also be used between the semiconductor chip 1 and the block 15.

In the invention embodiments described, MOSFET transistors are integrated in a semiconductor chip. Of course, the invention is applicable to other types of transistors as well as to other semiconductor components, such as thyristors, diodes, and triacs, that have at least two electrodes to be contacted on the same side of a semiconductor chip.

Moreover, the transistors described are arranged in rows. Naturally, other configurations are conceivable as well, and the source and drain areas may, e.g., be arranged in a checkered pattern.

In the embodiments described, the electrodes on a level more distant from the semiconductor chip are broader as well as thicker than those on a level closer to the semiconductor chip. However, this is by no means necessary. It is sufficient that the former electrodes are either broader or thicker, thereby obtaining a larger cross-sectional area and, consequently, a lower resistance than the electrodes on a level closer to the semiconductor chip.

Also, the invention is not restricted to electrodes produced by lithography or by mechanical means. For instance, the electrodes can be formed by screen printing or electrolysis. Preferably, the level of electrodes closest to the block 15 in the direction of the semiconductor chip can be electrolytically produced. It should also be observed that the electrodes can be made of different materials on different levels.

Finally, it should be mentioned that the term "lithography" is meant to encompass all techniques using radiation for providing patterns in the design of electrodes and insulating layers, regardless of the wavelength or the nature of the radiation.

We claim:

1. A semiconductor component, comprising:

a first component electrode;

a second component electrode;

a plurality of semiconductor elements integrated on a semiconductor chip;

each of said semiconductor elements including a first element electrode and a second element electrode, both provided on a same side of said semiconductor chip, so as to provide a plurality of first element electrodes, and a plurality of second element electrodes;

a plurality of first conductor means comprising a plurality of different levels of first conductors, including a level closest to said semiconductor chip, and a level furthest from said semiconductor chip; said first element electrodes providing said level of said first conductors closest to said semiconductor chip; said first conductors of said level furthest from said semiconductor chip being connected to said first component electrode; and said first conductors all being successively connected from level to level, so that all of said first element electrodes are effectively connected to said first component electrode; and a plurality of second conductor means comprising a plurality of different levels of second conductors, including a level closest to said semiconductor chip, and a level furthest from said semiconductor chip; said second element electrodes providing said level of said second conductors closest to said semiconductor chip; said second conductors of said level furthest from said semiconductor chip being connected to said second component electrode; and said second conductors all being successively connected from level to level, so that all of said second element electrodes are effectively connected to said second component electrode;

each respective level of said first conductors which is relatively further from said semiconductor chip containing fewer of said first conductors than each respective level of said first conductors which is relatively closer to said semiconductor chip; and each respective level of said second conductors which is relatively further from said semiconductor chip containing fewer of said second conductors than each respective level of said second conductors which is relatively closer to said semiconductor chip.

2. The semiconductor component of claim 1, wherein:

within each said level of said first conductors each first conductor is of similar transverse cross-sectional area, and, from level to level, said first conductors are progressively greater in transverse cross-sectional area further from said semiconductor chip; and within each said level of said second conductors each second conductor is of similar transverse cross-sectional area, and, from level to level, said second conductors are progressively greater in transverse cross-sectional area further from said semiconductor chip.

3. The semiconductor component of claim 2, wherein:

from level to level of said first conductors, said first conductors which are greater in transverse cross-sectional area, are greater in width and thickness; and from level to level of said second conductors, said second conductors which are greater in transverse cross-sectional area, are greater in width and thickness.

4. The semiconductor component of claim 3, wherein:

from the respective said level closest to said semiconductor chip, to the respective said level furthest from said semiconductor chip, respective of said first and second conductors increase in thickness and width by a factor of about 3.

5. The semiconductor component of claim 1, wherein:

respective of said levels of said first conductors correspond to respective of said levels of said second conductors, with the first and second conductors within each level being parallel to one another.

6. The semiconductor component of claim 5, further comprising:

a respective layer of insulation provided between each two succeeding ones of said levels;

said first conductors being connected to one another from level to level but isolated by the respective said layer of insulation from said second conductors from level to level; and said second conductors being connected to one another from level to level but isolated by the respective said layer of insulation from said first conductors from level to level.

7. The semiconductor component of claim 5, wherein:

from level to level, said conductors extend crosswise to respective ones of said conductors.

8. The semiconductor component of claim 5, wherein:

in one said level, all of said first and second conductors of said level have a first flat boundary surface in common, all said first conductors of said one level have a second flat boundary surface in common but which is not in common with the respective said second conductors of said one level, and all said second conductors of said one level have a third flat boundary surface in common but which is not in common with the respective said first conductors of said one level.

9. The semiconductor component of claim 8, wherein:

said first and second conductors of said one level are provided as elongated plates, said first conductors of said one level being offset in one direction relative to said second conductors of said one level; and respective layers of insulation being disposed between respective neighboring first and second conductors in said one level.

10. The semiconductor component of claim 9, wherein:

said first and second conductors and said layers of insulation of said one level are wound into a coil having an axial direction; and said one direction in which said first and second conductors of said one level are offset, is said axial direction.

11. The semiconductor component of claim 1, wherein:

said first conductors of said level of first conductors closest to said semiconductor chip and said second conductors of said level of second conductors closest to said semiconductor chip, are lithography-produced conductors.

12. The semiconductor component of claim 1, wherein:

said first conductors of one of said levels of first conductors and said second conductors of one of said levels of said second conductors, are electrolytically produced conductors.

13. The semiconductor component of claim 1, wherein:

said semiconductor elements are transistors, said first element electrodes are source electrodes, and said second element electrodes are drain electrodes.

14. The semiconductor component of claim 13, wherein:

said transistors are field-effect transistors.

* * * * *